(12) United States Patent
Huang

(10) Patent No.: US 7,119,440 B2
(45) Date of Patent: Oct. 10, 2006

(54) BACK END IC WIRING WITH IMPROVED ELECTRO-MIGRATION RESISTANCE

(75) Inventor: Chien-Chao Huang, Hisn-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/813,784

(22) Filed: Mar. 30, 2004

(65) Prior Publication Data

US 2005/0221554 A1 Oct. 6, 2005

(51) Int. Cl.
*H01L 23/48* (2006.01)
*H01L 21/4763* (2006.01)

(52) U.S. Cl. .................. 257/751; 257/765; 438/622; 438/627; 438/629; 438/637; 438/651

(58) Field of Classification Search ............. 438/622, 438/627, 629, 637, 687, 651; 257/750, 751, 257/765, 762
See application file for complete search history.

(56) References Cited

U.S. PATENT DOCUMENTS

| | | | | |
|---|---|---|---|---|
| 6,159,842 A | * | 12/2000 | Chang et al. | 438/622 |
| 6,355,558 B1 | * | 3/2002 | Dixit et al. | 438/642 |
| 6,376,353 B1 | * | 4/2002 | Zhou et al. | 438/612 |
| 2004/0000719 A1 | * | 1/2004 | Matsubara et al. | 257/767 |

* cited by examiner

*Primary Examiner*—Hsien-Ming Lee
(74) *Attorney, Agent, or Firm*—Tung & Associates

(57) ABSTRACT

A multi-level semiconductor device wiring interconnect structure and method of forming the same to improve electrical properties and reliability of wiring interconnects including an electromigration resistance and electrical resistance, the method including forming a dielectric insulating layer over a conductive portion; forming a via opening in closed communication with the conductive portion; forming a first barrier layer to line the via opening; forming a layer of AlCu according to a sputtering process to fill the via opening to form an AlCu via including a portion overlying the first dielectric insulating layer; and, photolithographically patterning and dry etching the portion to form an AlCu interconnect line over the AlCu via.

43 Claims, 3 Drawing Sheets

BACK END IC WIRING WITH IMPROVED ELECTRO-MIGRATION RESISTANCE

FIELD OF THE INVENTION

This invention generally relates to large scale integrated circuit (LSI) processing methods including formation of metallization interconnects and more particularly to an improved method and structure for wiring a multi-level semiconductor device.

BACKGROUND OF THE INVENTION

Metallization interconnects are critical to the proper electronic function of semiconductor devices. Several advances in integrated circuit manufacturing processing have been aimed at improving signal transport speed by reducing metal interconnect resistivities and improving resistance to electromigration effects. Copper has increasingly become a metal of choice in, for example, upper levels of metallization in a multi-level semiconductor device due to its low resistivity. Tungsten (W), however, has been used in the lower metallization layers, for example the PMD layer to form plugs or vias to contact underlying conductive areas including CMOS source and drain regions since it provides an effective diffusion barrier to metal diffusion from overlying copper metallization layers. Tungsten further has had acceptable resistance to electromigration in characteristic device dimensions of greater than about 0.25 microns and can effectively fill high aspect ratio vias by chemical vapor deposition (CVD) processes.

As device characteristic dimensions shrink, however, the prior art practice of forming tungsten plugs in lower metallization layers creates several problems. For example, the cost and complexity of processing increases, requiring increasingly complex processing including tungsten deposition, tungsten dry etchback, and/or CMP planarization processes to avoid respectively, for example, voids in tungsten plugs, tungsten particle contamination, and the formation of tungsten metal stringers. In addition, the electrical performance properties of tungsten, including electrical resistance are less than adequate for characteristic device dimensions less than about 0.25 microns. Moreover, the high temperature deposition processes currently required for tungsten as well as overlying conventional copper metallization leads to undesirable defects in previously deposited metallization layers.

Therefore, there is a need in the semiconductor processing art to develop an improved integrated circuit wiring structure and method for forming the same to achieve improved electrical performance as well as decreased processing complexity.

It is therefore an object of the invention to provide an improved integrated circuit wiring structure and method for forming the same to achieve improved electrical performance as well as decreased processing complexity, while overcoming other shortcomings of the prior art.

SUMMARY OF THE INVENTION

To achieve the foregoing and other objects, and in accordance with the purposes of the present invention, as embodied and broadly described herein, the present invention provides a multi-level semiconductor device wiring interconnect structure and method of forming the same to improve electrical properties and reliability of wiring interconnects including an electromigration resistance and electrical resistance.

In a first embodiment, the method includes forming a dielectric insulating layer over a conductive portion; forming a via opening in closed communication with the conductive portion; forming a first barrier layer to line the via opening; forming a layer of AlCu according to a sputtering process to fill the via opening to form an AlCu via including a portion overlying the first dielectric insulating layer; and, photolithographically patterning and dry etching the portion to form an AlCu interconnect line over the AlCu via.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to an exemplary generic multi-level integrated circuit including CMOS transistor devices, it will be appreciated that the method of the present invention is particularly applicable to formation of logic circuits, and memory circuits, including heterogeneous integrated circuits such as mixed signal circuitry including analog conditioning circuitry and combinations of the foregoing, where the advantages of increased electromigration resistance, reduced RC delay time constant, and reduced via contact resistance are particularly advantageous. In addition, although the method of the present invention may be applied to integrated circuits with characteristic dimensions greater than about 0.25 microns, the structure and method of the present invention is particularly advantageous for integrated circuits with characteristic device dimensions less than about 0.25 microns, including 0.18 microns and 0.13 microns.

Figure 1A:
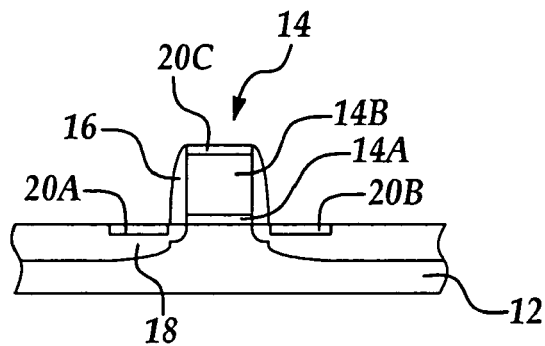
FIGS. 1A–1E are cross sectional side view representations of a portion of a multi-level integrated circuit at stages in manufacture according to the method of the present invention.

Referring to FIGS. 1A–1E, in an exemplary embodiment of the method of the present invention, cross sectional side view portions of a multi-level integrated circuit are shown at stages in an exemplary manufacturing process. Referring to FIG. 1A, is shown a semiconductor substrate 12, for example, including, but is not limited to, silicon, silicon on insulator (SOI), stacked SOI (SSOI), stacked SiGe on insulator (S-SiGeOI), SiGeOI, and GeOI, and combinations thereof.

Still referring to FIG. 1A, formed on the semiconductor substrate 12 is a conventional CMOS device 14, for example including a gate dielectric portion 14A and gate electrode portion 14B. Spacers e.g., 16, are formed adjacent either side of the CMOS device by conventional methods which may include forming composite layers of oxide and nitride. Doped source and drain regions e.g., 18 are formed by conventional methods using the spacers to align the source and drain regions. The CMOS device 14 preferably forms a portion of a logic circuit, a memory circuit, an analog circuit, or a heterogeneous (mixed signal) integrated circuit including combinations of the foregoing.

In an important aspect of the invention, self aligned metal silicide (salicide) regions e.g., 20A, 20B, and 20C are formed over source and drain regions e.g., 18 and over the gate electrode portion 14B, by conventional processes including depositing a metal layer over the process surface followed by an annealing process to form a low resistance silicide phase, preferably $TiSi_2$ or $CoSi_2$. The excess metal e.g., Co or Ti is then removed by a wet etching process to leave the salicide regions 20A, 20B, and 20C.

Figure 1B:
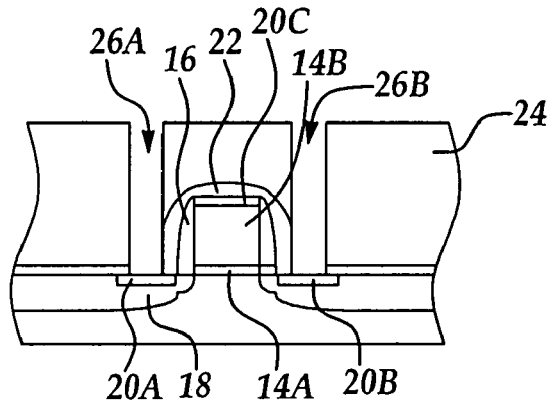

Referring to FIG. 1B, a contact etch stop (CES) layer 22 is then formed over the CMOS device 14, preferably formed of silicon nitride and/or silicon oxynitride by a conventional PECVD or LPCVD process. A first dielectric insulating layer 24, also referred to as a pre-metal dielectric (PMD) is then formed over the CES layer 22, followed by a planarization step, for example CMP. One or more via openings e.g., 26A and 26B are then etched through the dielectric insulating layer and through the CES layer 22 to contact salicide regions e.g., 20A, 20B and optionally 20C (not shown).

In an important aspect of the invention, the via openings e.g., 26A and 26B are formed with an aspect ratio greater than about 1.5, more preferably greater than about 2.8, preferably having substantially vertical sidewalls, for example having a sidewall angle with respect to horizontal of greater than about 85 degrees. The dielectric insulating layer 24 is preferably formed of a low-K dielectric having a dielectric constant less than about 3.5, most preferably fluorinated silicate glass (FSG) formed by a conventional HDP-CVD or PECVD process, but which may also be formed of another silicon oxide based material such as BPSG or BPTEOS.

Figure 1C:
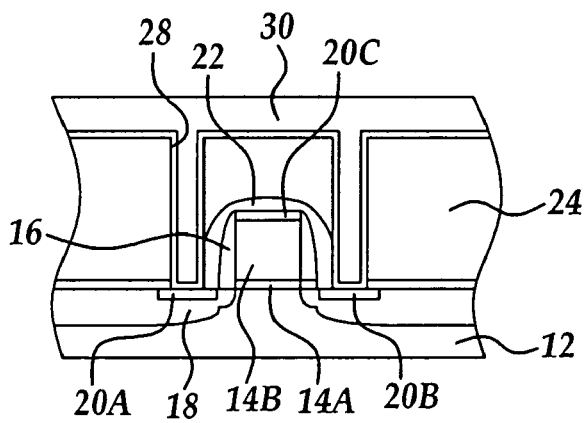

Referring to FIG. 1C, a barrier layer e.g., 28 of Ti/TiN, TiN, Ta, TaN, or combinations thereof, is first formed to line the via openings. Preferably the barrier layer is deposited with a thickness less than about 400 Angstroms to decrease a contact electrical resistance of the vias. The barrier layer 28 may be deposited by a conventional PVD process with a collimator, but is more preferably deposited according to a low temperature and low pressure magnetron sputtering process, for example at a temperature less than about 400° C., including at about room temperature for example, less than about 30° C., and at a pressure of less than about 5 milliTorr.

In another aspect of the invention, following formation of the barrier layer 28, preferably according to a magnetron sputtering process the remaining portion of the via openings are filled with an AlCu alloy filling 30, according to a low pressure magnetron sputtering process, preferably at pressures less than about 5 milliTorr, and at temperatures less than about 400° C., including at about room temperature for example, less than about 30° C. The AlCu preferably has a copper content of about 2 to about 10 atomic weight percent with respect to aluminum. In the case magnetron sputtering is used to form, the barrier layer, the AlCu deposition may be performed in-situ, improving metal adhesion to the barrier layer. Alternatively, the barrier layer 28 may be formed by a conventional PVD process prior to depositing the AlCu by the low temperature/low pressure magnetron sputtering process.

Figure 1D:
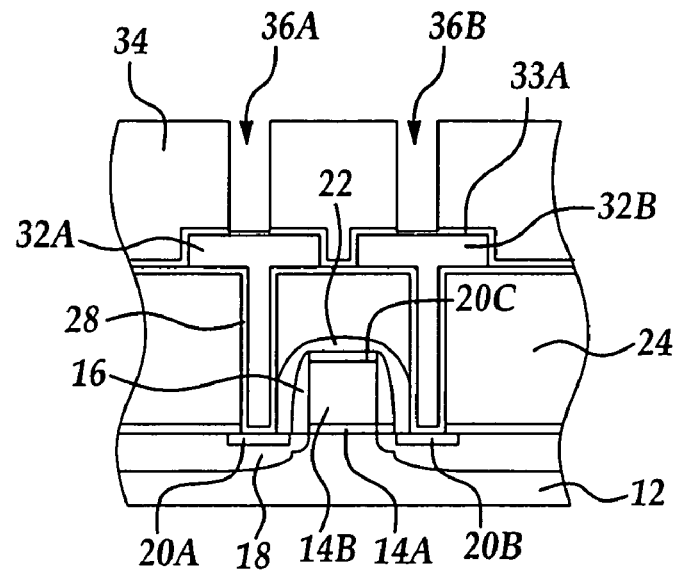

Referring to FIG. 1D, following formation of the AlCu layer 30, a conventional photolithographic patterning process is carried out to pattern metal lines over the vias followed by a metal etching process to form AlCu interconnect lines e.g., 32A and 32B contiguous with underlying via portions. Optionally, a second barrier layer 33A, the same or different material as the first barrier layer 28 may be blanket deposited over the AlCu interconnect lines e.g., 32A, and 32B by a conventional PVD process or the low pressure magnetron processes previously outlined, prior to forming an overlying IMD layer explained below. Advantageously, a CMP process and formation of a capping layer required in prior art damascene processes prior to forming the interconnect lines e.g., 32A and 32B is unnecessary according to the present invention.

Still referring to FIG. 1D, a second dielectric insulating layer, also referred to as an inter-metal dielectric (IMD) layer 34, also referred to as metallization layer e.g., M2 following formation of metal interconnects, is formed over the AlCu interconnect lines e.g., 32A and 32B. The IMD layer 34 is preferably formed of FSG. An ARC layer (not shown) is preferably formed over the IMD layer 34 followed by a conventional photolithographic patterning process to pattern second via openings overlying the AlCu interconnect lines 32A and 32B respectively, followed by a conventional dry etching process to form second via openings 36A and 36B exposing the underlying interconnect lines e.g., 32A and 32B.

Figure 1E:
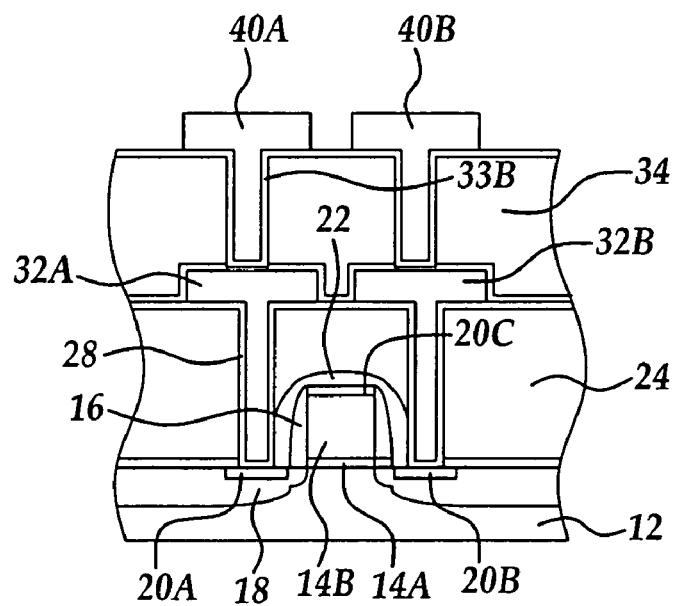

Referring to FIG. 1E, a third barrier layer e.g., 33B the same or different material as the first and second barrier layers is then first formed to line the via openings followed by the low pressure/low temperature magnetron sputtering process carried out in the same manner as previously outlined to deposit AlCu layer 38 to fill the via openings 36A and 36B including a portion overlying the IMD layer 34 surface. A second photolithographic patterning and dry metal etching process is then carried out as previously outlined to form AlCu interconnect lines 40A and 40B contiguous with via portions. The previously outlined processes may then be sequentially repeated to form overlying metallization portions making up overlying metallization layers in a similar manner.

Figure 2:
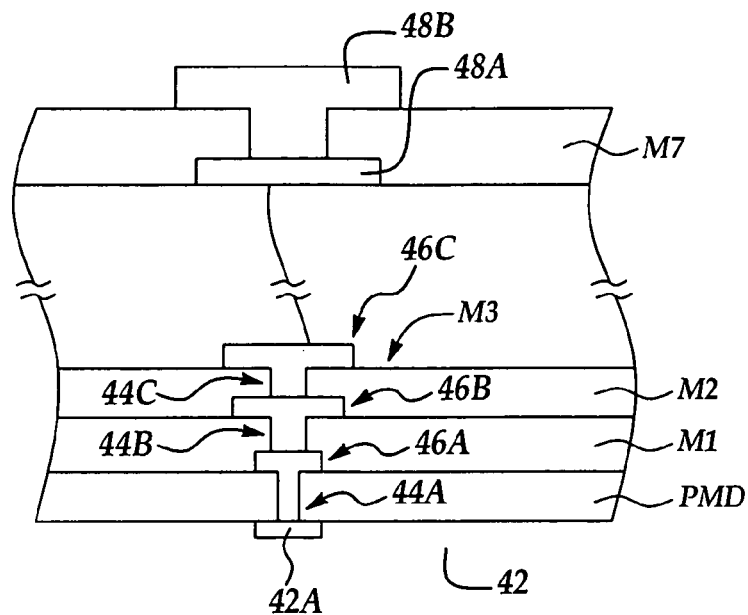
FIG. 2 is a cross sectional view of an exemplary multi-level wiring semiconductor device according to an embodiment of the invention.

Referring to FIG. 2, is shown a portion of an exemplary multi-level integrated circuit wiring structure according to an embodiment of the invention. For example, shown is PMD layer and metallization layers e.g., M1, M2, a portion of M3 and an uppermost metallization layer e.g., M7. In one embodiment, all or a portion of the metallization layers e.g., M1 through M7 as well as the PMD layer including contact via portion of the PMD metallization e.g., 44A are formed by carrying out the processes previously outlined in FIGS. 1A–1E for each of the metallization layers e.g., M1 through M7. It will be appreciated that the number of metallization layers may be more or less than 7. In another embodiment, at least the first two metallization layers e.g., M1 and M2, more preferably at least the first 3 metallization layers, e.g., M1 through M3 include metal interconnect lines e.g., 46A, 46B, and 46C overlying and contiguous with via portions e.g., 44A, 44B, and 44C, formed of AlCu according to preferred embodiments outlined in FIGS. 1A through 1E.

The dielectric insulating layers (IMD layers) corresponding to the metallization layers e.g., M1 through M7 are preferably formed of FSG to add increased metal diffusion resistance and barrier layer adhesion. In another embodiment, the contact via portion e.g., 44A formed in the PMD layer to contact silicide portion 42A (e.g., S/D region-CMOS device not shown) formed on semiconductor substrate 42, is formed of tungsten by a conventional tungsten plug formation process followed by forming the overlying metallization portions at least through M3, of AlCu according to preferred embodiments. More preferably, however, the contact via e.g., 44A is formed of AlCu and is contiguous with interconnect line portion 46A as previously outlined. It will also be appreciated that metallization portions in M3 or above overlying an AlCu metallization portion e.g., interconnect line portion 46C may be formed by conventional copper damascene processes where the dielectric insulating layer may be formed of either FSG or a porous silicon oxide low-K material such as carbon doped oxide or OSG. In addition, the uppermost metallization later e.g., M7 is preferably formed of AlCu including contiguous metallization portion e.g., 48B overlying conductive line 48A e.g., AlCu formed according to preferred processes. It will be appreciated that all of the metallization layers including the PMD layer may be formed of AlCu according to preferred embodiments.

Thus an improved method for forming wiring in large scale integrated circuitry has been presented whereby interconnect lines are formed with improved reliability and void free at low temperatures thereby reducing defects induced by higher temperature processes. In addition, the AlCu wiring has improved electromigration resistance compared to copper and/or tungsten and has no via/interconnect line interface electrical resistance within a metallization layer. Advantageously, the process according to the present invention avoids costly CMP processes to planarize a metallization layer e.g., in a damascene or dual damascene process prior to forming an overlying metallization layer and eliminates the need for capacitance contributing etch stop and capping layers between metallization layers.

For example, it has been found that by using a low-temperature and low pressure magnetron sputtering process according to the present invention, high aspect ratio openings, for example greater than about 2.8 may be filled with the preferred AlCu alloys void free, with improved adhesion and lower electro-migration resistance and a lower via/interconnect line electrical resistance. This is especially advantageous in back-end-of-line wiring processes, since prior art processes carried out at higher temperatures e.g., greater than about 400° C. can lead to void formation and thermally induced defects in underlying metallization layers as well as undesired dopant diffusion in doped CMOS regions. Thus, the method and multi-level wiring structure of the present invention is especially advantageous for multi-level semiconductor devices having characteristic dimensions less than about 0.25 microns including logic circuits, memory circuits, analog circuits, as well as heterogeneous integrated circuits including embedded combinations of the foregoing.

Figure 3:
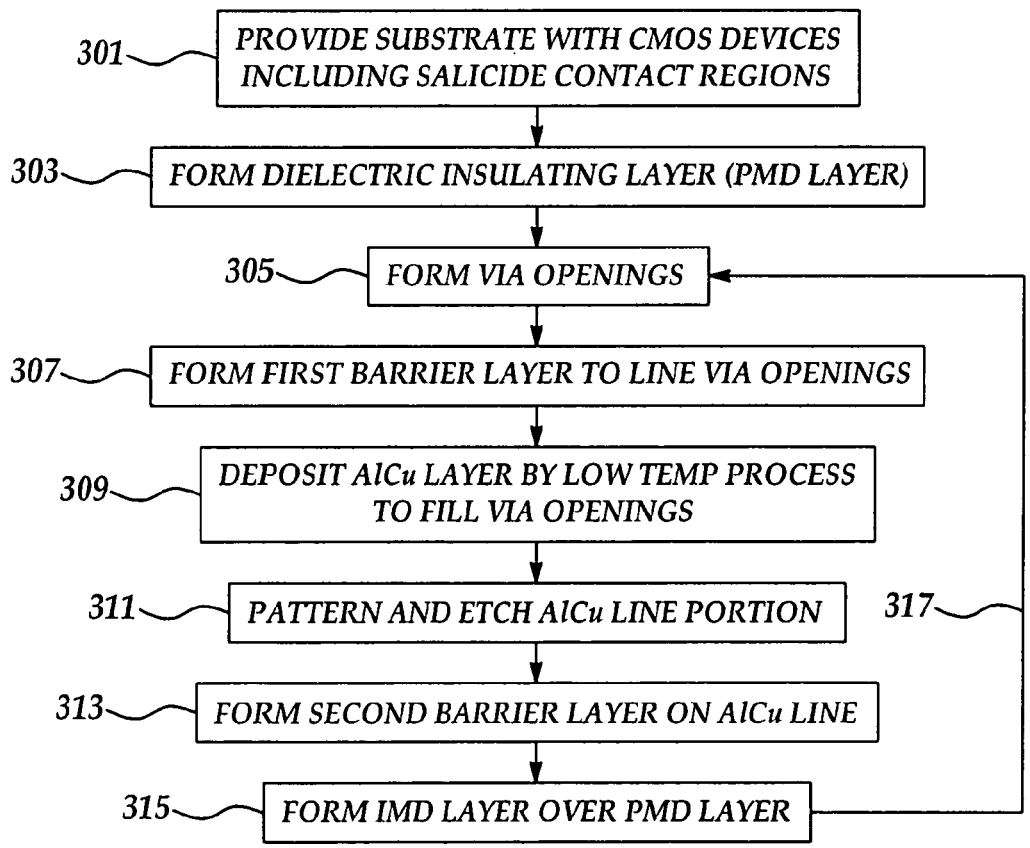
FIG. 3 is a process flow diagram including several embodiments of the present invention.

Referring to FIG. 3 is a process flow diagram including several embodiments of the present invention. In a first process 301, a semiconductor substrate including CMOS transistors with salicide contact areas is provided. In process 303, a PMD dielectric insulating layer is formed over the CMOS transistors. In process 305, first vias are formed in closed communication with salicide areas. In process 307, a first barrier layer is formed to line the first vias. In process 309, an AlCu layer is deposited by a low temperature process to backfill the vias according to preferred embodiments including a portion overlying the PMD layer. In process 311, AlCu interconnect lines are patterned and etched in the overlying AlCu portion. In process 313, a second barrier layer is formed over the AlCu interconnect lines. In process 315, an IMD dielectric insulating layer is formed over the interconnect lines. As indicated by process arrow 317, processes 307 through 315 are sequentially repeated to form AlCu vias and interconnect lines in overlying levels through at least the third metallization level (M3).

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming a multi-level semiconductor device wiring interconnect structure according to a low temperature process comprising the steps of:
   a) forming a dielectric insulating layer over a conductive portion; said conductive portion comprises silicide electrical contact areas comprising a CMOS transistor portion selected from the group consisting of a gate electrode and source and drain regions;
   b) forming a via opening in closed communication with the conductive portion;
   c) forming a first barrier layer to line the via opening;
   d) then forming a layer of AlCu to fill the via opening to form an AlCu via including a portion of said AlCu layer overlying the dielectric insulating layer; and,
   e) forming an AlCu interconnect line from said portion of said AlCu layer over the AlCu via, wherein a second barrier layer is optionally formed on said AlCu interconnect line;
   wherein process steps c) and d) are carried out at a temperature of less than about 400 degrees Centigrade.

2. The method of claim 1, wherein steps a) through e) are repeated to sequentially form an overlying AlCu via contiguous with an overlying AlCu interconnect line.

3. The method of claim 1, wherein the step of forming a layer of AlCu comprises a magnetron sputtering process carried out at from about room temperature to about 400° C.

4. The method of claim 3, wherein the magnetron sputtering process is carried out at pressure less tan about 5 milliTorr.

5. The method of claim 1, wherein the dielectric insulating layer is selected from the group consisting of carbon doped silicon oxide, organo silicate glass (OSG), and fluorinated silicate glass (FSG).

6. The method of claim 1, wherein the dielectric insulating layer consists essentially of fluorinated silicate glass (FSG).

7. The method of claim 1, wherein the first and second barrier layers is selected from the group consisting of Ti/TiN, TiN, Ta, TaN, and combinations thereof.

8. The method of claim 1, wherein the silicide electrical contact areas comprise a metal silicide selected from the group consisting of $TiSi_2$ and $CoSi_2$.

9. The method of claim 1, wherein the CMOS transistor forms a portion of a circuit selected from the group consisting of logic circuitry, memory circuitry, analog circuitry, or combinations thereof.

10. The method of claim 1, wherein steps a) through e are repeated to form at least 3 metallization layers over a PMD layer.

11. The method of claim 1, wherein steps a) through e are repeated to form a multi-level semiconductor device consisting essentially of AlCu wiring.

12. The method of claim 1, wherein the second barrier layer is formed to encapsulate said AlCu interconnect line on three sides.

13. A method of forming a multi-level semiconductor device wiring interconnect structure according to a low temperature process to improve electrical properties including an electro-migration resistance and electrical resistance comprising the steps of:

a) forming a dielectric insulating layer over a conductive portion;
wherein the conductive portion comprises salicide electrical contact areas comprising a CMOS transistor portion;
b) forming a via opening in closed communication with the conductive portion;
c) forming a barrier layer to line the via opening;
d) forming a layer of AlCu at a temperature less than about 400° C. to fill the via opening to form an AlCu via including a portion of said AlCu layer overlying the dielectric insulating layer;
e) forming an AlCu interconnect line from said portion of said AlCu layer over the AlCu via; and,
f) optionally forming a second barrier layer on the AlCu interconnect line.

14. The method of claim 13, wherein steps b through f are repeated in overlying dielectric insulating layers to sequentially form AlCu vias and AlCu interconnect lines through at least 3 metallization levels.

15. The method of claim 13, wherein the step of forming an AlCu layer is a carried out at pressures less than about 5 milliTorr.

16. The method of claim 13, wherein the dielectric insulating layer consists essentially of fluorinated silicate glass (FSG).

17. The method of claim 13, wherein the via openings are formed with an aspect ratio greater than 1.5.

18. The method of claim 13, wherein the barrier layers are selected from the group consisting of Ti/TiN, TiN, Ta, TaN, and combinations thereof.

19. The method of claim 13, wherein the salicide electrical contact areas comprise a metal suicide selected from the group consisting of $TiSi_2$ and $CoSi_2$.

20. The method of claim 13, wherein the CMOS transistor forms a portion of a circuit selected from the group consisting of logic circuitry, memory circuitry, analog circuitry, and combinations thereof.

21. The method of claim 13, wherein steps b through f are repeated in overlying dielectric insulating layers to form at least 3 metallization layers over a pre-metal dielectric layer.

22. The method of claim 13, wherein steps b through f are repeated in overlying dielectric insulating layers to form a multi-level semiconductor device consisting essentially of AlCu wiring.

23. The method of claim 13, wherein the second barrier layer is formed to encapsulate said AlCu interconnect line on three sides.

24. A multi-level wiring interconnect structure for a semiconductor device comprising:
a) a dielectric insulating layer over a conductive portion said conductive portion selected from the group consisting of tungsten, metal silicide, copper, and AlCu;
b) an AlCu via comprising a first barrier layer formed in the dielectric insulating layer in closed communication with the conductive portion;
c) an AlCu interconnect line disposed on and contiguous with the AlCu via;
wherein a second barrier layer encapsulates the AlCu interconnect line on three sides.

25. The multi-level wiring interconnect structure of claim 24, wherein structure portions a) through c) are stacked sequentially to comprise at least three metallization layers.

26. The multi-level wiring interconnect structure of claim 24, wherein structure portions a) through c) are stacked sequentially to form a multi-level semiconductor device consisting essentially of AlCu wiring.

27. The multi-level wiring interconnect structure of claim 24, wherein the dielectric insulating layer is selected from the group consisting of carbon doped silicon oxide, organo silicate glass (OSG), and fluorinated silicate glass (FSG).

28. The multi-level wiring interconnect structure of claim 24, wherein the dielectric insulating layer consists essentially of fluorinated silicate glass (FSG).

29. The multi-level wiring interconnect structure of claim 24, via openings are formed with an aspect ratio greater than 1.5.

30. The multi-level wiring interconnect structure of claim 24, wherein the first and second barrier layers are selected from the group consisting of Ti/TiN, TiN, Ta, TaN, and combinations thereof.

31. The multi-level wiring interconnect structure of claim 24, wherein the conductive portion comprises silicide electrical contact areas comprising a CMOS transistor portion selected from the group consisting of a gate electrode and source and drain regions.

32. The multi-level wiring interconnect structure of claim 31, wherein the suicide electrical contact areas comprise a metal suicide selected from the group consisting of $TiSi_2$ and $CoSi_2$.

33. The multi-level wiring interconnect structure of claim 31, wherein the CMOS transistor forms a portion of a circuit selected from the group consisting of logic circuitry, memory circuitry, analog circuitry, and combinations thereof.

34. A multi-level wiring interconnect structure for a semiconductor device comprising:
a) a dielectric insulating layer over a conductive portion;
wherein the conductive portion comprises salicide electrical contact areas comprising a CMOS transistor portion;
b) an AlCu via comprising a barrier layer lining the AlCu via opening, said via opening formed in the dielectric insulating layer in closed communication with the conductive portion;
wherein structure portions b is stacked sequentially in overlying dielectric insulating layers to comprise at least three metallization layers.

35. The multi-level wiring interconnect structure of claim 34, wherein structure portion b stacked sequentially in overlying dielectric insulating layers to form a multi-level semiconductor device consisting essentially of AlCu wiring.

36. The multi-level wiring interconnect structure of claim 34, wherein the dielectric insulating layer is selected from the group consisting of carbon doped silicon oxide, organo silicate glass (OSG), and fluorinated silicate glass (FSG).

37. The multi-level wiring interconnect structure of claim 34, wherein the dielectric insulating layer consists essentially of fluorinated silicate glass (FSG).

38. The multi-level wiring interconnect structure of claim 34, wherein said via opening is Conned with an aspect ratio grater than 1.5.

39. The multi-level wiring interconnect structure of claim 34, wherein the barrier layer is selected from the group consisting of Ti/TiN, TiN, Ta, TaN, and combinations thereof.

40. The multi-level wiring interconnect structure of claim 34, wherein the silicide electrical contact areas comprise a metal silicide selected from the group consisting of $TiSi_2$ and $CoSi_2$.

41. The multi-level wiring interconnect structure of claim 34, wherein the CMOS transistor forms a portion of a circuit selected from the group consisting of logic circuitry, memory circuitry, analog circuitry, and combinations thereof.

42. The multi-level Wiring interconnect structure of claim 34, further comprising an AlCu interconnect line disposed on the AlCu via.

43. The multi-level wiring interconnect structure of claim 42 further comprising a second barrier layer on the AlCu interconnect line.

* * * * *